(12) United States Patent
Lisec et al.

(10) Patent No.: US 6,655,923 B1
(45) Date of Patent: Dec. 2, 2003

(54) MICROMECHANIC PUMP

(75) Inventors: Thomas Lisec, Itzehoe (DE); Bernd Wagner, Looft (DE)

(73) Assignee: Fraunhofer Gesellschaft zur Forderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/979,138

(22) PCT Filed: May 5, 2000

(86) PCT No.: PCT/DE00/01429
§ 371 (c)(1),
(2), (4) Date: Mar. 22, 2002

(87) PCT Pub. No.: WO00/70224
PCT Pub. Date: Nov. 23, 2000

(30) Foreign Application Priority Data

May 17, 1999 (DE) .......................... 199 22 612
Apr. 7, 2000 (DE) .......................... 100 17 164

(51) Int. Cl.$^7$ .............................. F04F 11/00; F04B 17/00
(52) U.S. Cl. .................. 417/92; 417/413.1; 417/413.2; 417/413.3; 417/412; 417/474
(58) Field of Search ................ 417/92, 413.1, 417/413.2, 413.3, 412, 474

(56) References Cited

U.S. PATENT DOCUMENTS

| | | | | |
|---|---|---|---|---|
| 5,096,388 A | * | 3/1992 | Weinberg | 417/413.3 |
| 5,380,396 A | * | 1/1995 | Shikida et al. | 216/2 |
| 5,705,018 A | | 1/1998 | Hartley | 156/345 |
| 5,725,363 A | * | 3/1998 | Bustgens et al. | 417/413.1 |
| 6,007,309 A | * | 12/1999 | Hartley | 417/322 |
| 6,106,245 A | * | 8/2000 | Cabuz | 417/322 |
| 6,579,068 B2 | * | 6/2003 | Bridger et al. | 417/413.1 |

FOREIGN PATENT DOCUMENTS

| | | |
|---|---|---|
| DE | 92 09 402 | 9/1992 |
| DE | 197 19 862 | 11/1998 |
| EP | 0 518 524 | 12/1992 |
| EP | 0 439 327 | 11/1998 |
| WO | WO 95/18307 | 7/1995 |
| WO | WO 97/29538 | 8/1997 |

* cited by examiner

Primary Examiner—Charles G. Freay
Assistant Examiner—Michael K. Gray
(74) Attorney, Agent, or Firm—Crowell & Moring LLP

(57) ABSTRACT

A micromechanical pump has a membrane (2) positioned above a substrate (1). The substrate is provided with a cavity (8) which is formed in an endlessly continuous shape (e.g., circular) to provide a channel for a drive fluid. A cover (9) is positioned above the substrate with the membrane being between the substrate and cover. The cover is provided with an inlet (11) and outlet (10). Electrodes (3, 4) are provided around the floor of the cavity. The electrodes are selectively actuated so as to attract selected areas of the membrane resulting in a gap forming between the cover and the selected areas of the membrane. The areas of the membrane above the non-selected electrodes form a seal with the cover. By selectively actuating the electrodes a peristaltic pumping action results in a pumped fluid traveling from the inlet, through the gaps and out the outlet.

19 Claims, 5 Drawing Sheets

MICROMECHANIC PUMP

BACKGROUND AND SUMMERY OF THE INVENTION

This application claims the priority of German Patent Document 199 22 612.1, filed May 17, 1999.

The invention relates to a micromechanical pump, with a peristaltic actuator for transporting and/or managing defined quantities of liquid or gas (pump medium).

The metering of minimum quantities of liquid in the microliter up to the nanoliter range is becoming ever more relevant for many applications in analytic chemistry and medical or environmental engineering. Frequently it is of interest to receive a defined quantity of liquid at one place, to transport it and deliver it at another place. Tasks of this nature are an essential part of quantitative analysis. Modern equipment can meter a few tens of microliters up to a few hundred microliters of a liquid with an accuracy of better than one percent by means of stepping motor-controlled injection pumps and precision pipettes. To manipulate, however, quantities of a few hundred nanoliters up to a few tens of microliters with the same accuracy, it is necessary to find other concepts of metering.

The micropump-based metering systems are dominated by two concepts. On the one hand, membrane pumps with two passive valves are used, and, on the other hand, valveless pumps, according to the diffuser nozzle principle, which are not sealed in the idle state, are used. Both types are unidirectional. That is, they can transport only in one direction. In both cases piezo actuators, which are cemented on the pump membrane, are usually used as the drive. An electrostatically driven micromembrane pump with passive valves is known from the German Patent DE 19719862. At high drive frequencies, this pump's direction of delivery reverses itself owing to the inertia of the passive valves. However, this property can be used only to a limited degree for pumping backwards. The delivery rate is a function not only of the supplied power, but also of the properties of the pump medium to be pumped. Therefore, it is not possible to conclude from the supplied electric power the flow rate of an arbitrary pump medium. Since the volume displaced at each stroke of the pump is only a fraction of the volume of the pump chamber, the pump has a high dead volume.

The U.S. Pat. No. 57 05 018 discloses a micromechanical peristaltic pump, where the medium to be pumped is delivered by means of an electrically conductive membrane in a cavity equipped with electrodes. This pump has the drawback that it does not seal in the idle state and that the voltage between membrane and electrodes decreases across the medium to be pumped. Pumps with a circular drive element are disclosed, for example, in the WO 98/07199.

The principle of a pneumatic coupling of entrapped air volumes for a microvalve is known from the published German patent application DE 196 37 928 A1, where a micropump system, based on this principle, is disclosed. The drawback of this system is that the membrane does not form a tight seal at the cover. Hence, additional valves are needed to guarantee that the pump is tight in the idle state. Furthermore, since the delivery channel does not exhibit an endlessly continuous shape, the pump medium cannot be transported continuously without interruption. These drawbacks have a negative effect on the accuracy of the metering capability and on the output of the pump.

In summary one can state that there exist no metering systems that receive a predetermined quantity of liquid at one place and deliver it again at another place. Micropumps, which can meter precisely in the range below ten microliters, are also not available.

The invention is based on the problem of providing a bidirectional micropump, which can both transport in the microliter range continuously and manage defined volumes of liquid.

The micromechanical pump, based on the principle of a peristaltic actuator, is formed by stretching sealingly an electrically conductive membrane over a preferably ring-shaped hollow space, which continues endlessly in the linear direction and is filled with a drive medium, in a substrate (cavity). Electrodes, which can be driven separately at least to some degree, are installed permanently on the floor of the cavity. When some of the electrodes are driven, the membrane above the driven electrodes is pulled downwards; and through displacement of the drive medium the membrane above the non-driven electrodes is pressed upwards.

In this respect the electrodes have to be separated from the membrane with a passivating layer so that in the driven state no short circuit can occur between the electrodes and the membrane. This layer is applied preferably on the underside of the membrane and in the case of a silicon membrane is made preferably of a silicon oxide.

Because the cavity is closed, i.e. forms a hollow space with a fixed volume, and because this cavity contains the drive medium, the membrane must bulge upwards, owing to the displacement of the drive medium out of the areas of the cavity, in which the membrane is pulled downwards, to locations where the electrodes are not driven. If an adequate number of electrodes are driven, the drive medium is compressed below the upwardly bulging membrane areas in such a manner that the buckled areas are pressed firmly against the cover. This effect is called pneumatic coupling. While the electrodes are driven in pairs by a suitable method next to the buckled areas, the buckled areas can be slid over the cavity. The actuation of the electrodes is switched off in the pumping direction behind the buckling and switched on in front. Thus, it involves an indirect drive. The pump medium is displaced in the pumping direction not directly by the actuation of the electrodes, but by the displacement of one or several of the buckled area(s), under which the drive medium is compressed. The drive medium can be a liquid or a gas. If it is a liquid, then the volume of the liquid quantity must be less than the volume of the cavity. Owing to the incompressibility of liquids, the membrane cannot bulge downwards. Owing to the smaller volume of liquid, the membrane is bulged downwards already in the unactuated state. The results are analogous when, in the case of a gas as the drive medium, there is a vacuum in the hollow space of the cavity covered by the membrane.

It is especially advantageous, in the case of a vacuum of the drive medium or in the case of a liquid as the drive medium, if the membrane is under compressive stress, so that it forms a buckled area by itself (spontaneous buckling) without having to drive the electrodes. The spontaneous buckling can be achieved, for example, with a silicon membrane by oxidizing on a layer of silicon oxide. Such a membrane has the property that it bulges downwards and in other areas upwards in some areas over the cavity. The pump, according to the invention, holds its state, assumed last, by actuating the electrodes, even when the actuation of the electrodes is switched off. In the unpowered, i.e. non-driven state, the pump medium cannot flow through the pump in the case of spontaneous buckling of the membrane. In the ideal case the spontaneous buckling is characterized in conjunction with the vacuum or the fixed volume of liquid in the cavity in such a manner that the result is a desired number of seals, which are just adequately wide to cover the inlets and outlets of the pump.

To build a pump, the drive element, i.e. the membrane, is tightly covered with a flat cover, containing the inlet and the outlet. In the areas of the driven electrodes, where the membrane is pulled downwards, the result is a gap between the cover and the membrane, whereas in the areas of the, non-driven electrodes the membrane is pressed against the cover. This gap serves to receive the pump medium. When the electrodes are driven selectively, the area, in which the membrane is pressed against the cover, can be moved peristaltically from the inlet to the outlet. The pump medium, enclosed in the gap, is transported so as to be defined. However, the cover can also exhibit a notched surface above the cavity that is similar to the cavity, thus a passage. Due to the high forces pressing the membrane against the cover due to pneumatic coupling in the buckled membrane areas, the buckled area can adapt in accordance with the elasticity of the membrane to the shape of the passage.

Especially advantageous is the preferably annular shape of the cavity which forms an endlessly continuous channel for a drive medium such that the cross sectional shape of the cavity can match the shape of the downwards buckled membrane and the shape of the electrode is also curved in such a manner. In this case even if the membrane rests tightly against the substrate in the driven state and the drive medium can be displaced, therefore, only in the pumping direction, a continuous pumping process can be maintained. This would not be possible in the case of a cavity that were not endlessly continuous, since then the electrodes would have to be driven in such a manner that the drive medium for the next pump cycle would have to be displaced again in the direction of the inlet.

The cross sectional shape of the cavity that is adapted to the downwards buckled membrane is especially advantageous, if the drive medium is a gas, because then, as the electrodes are driven, the pressure increase in the gas, due to its lower volume, is especially high; and the membrane in the unselected areas is pressed tighter against the cover; and, therefore, the pump seals better. This feature is especially advantageous when used as a valve.

The pump is bidirectional. That is, there is the possibility of reversing at any time the pumping direction; and the pump has a low dead volume, a feature that is of decisive importance for pumps with compressible mediums, i.e., gases. The suction and the pump pressure of the pump, according to the invention, are approximately identical, since the shape of the bulges produced by the compressed gas or the fixed volume of the drive medium liquid is determined on all sides by means of the driven electrodes. The drive can occur separately from the medium. That is, the electrodes do not make contact with the pump medium. In particular, the voltage between the driven electrodes and the membrane must not drop directly across the pump medium.

Because the capacity between individual electrodes and the membrane in the arched areas differs considerably from the capacity in the areas adjoining below, the pumping process can be monitored electronically. Controlled metering of the smallest quantity of liquid is possible.

Another advantage is that the membrane is under compressive stress, that is, bulges in sub-areas without any actuation (spontaneous bulging), so that because it is less necessary for the membrane to expand, less force has to be expended to move the arched areas, serving as a seal, inside the cavity. When the membrane is under compressive stress, less force is needed to form the defined bulges, since sub-areas of the membrane are already bulged downwards and thus, in these areas, no force has to be generated to stretch the membrane in the direction of the cavity. Then the pump can be driven with significantly less voltage; and the result is a bistable valve, whose switching states can be held without power.

The present invention is described below with reference to the embodiments and the drawings without restricting the general inventive idea.

DETAILED DESCRIPTION OF THE PREFERRED EMBODIMENTS

Figure 1A:
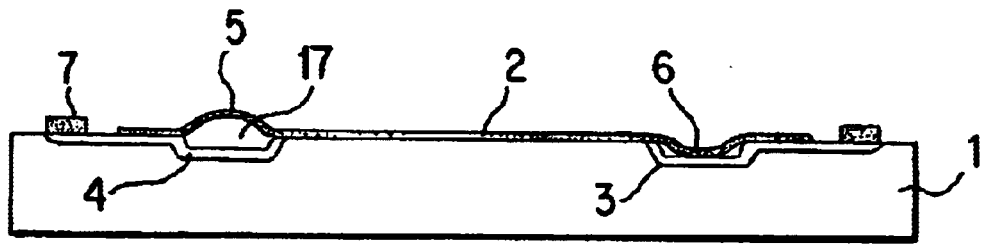
FIG. 1a is a cross sectional view and FIG. 1b is a top view of a drive element of the micropump.
Figure 1B:
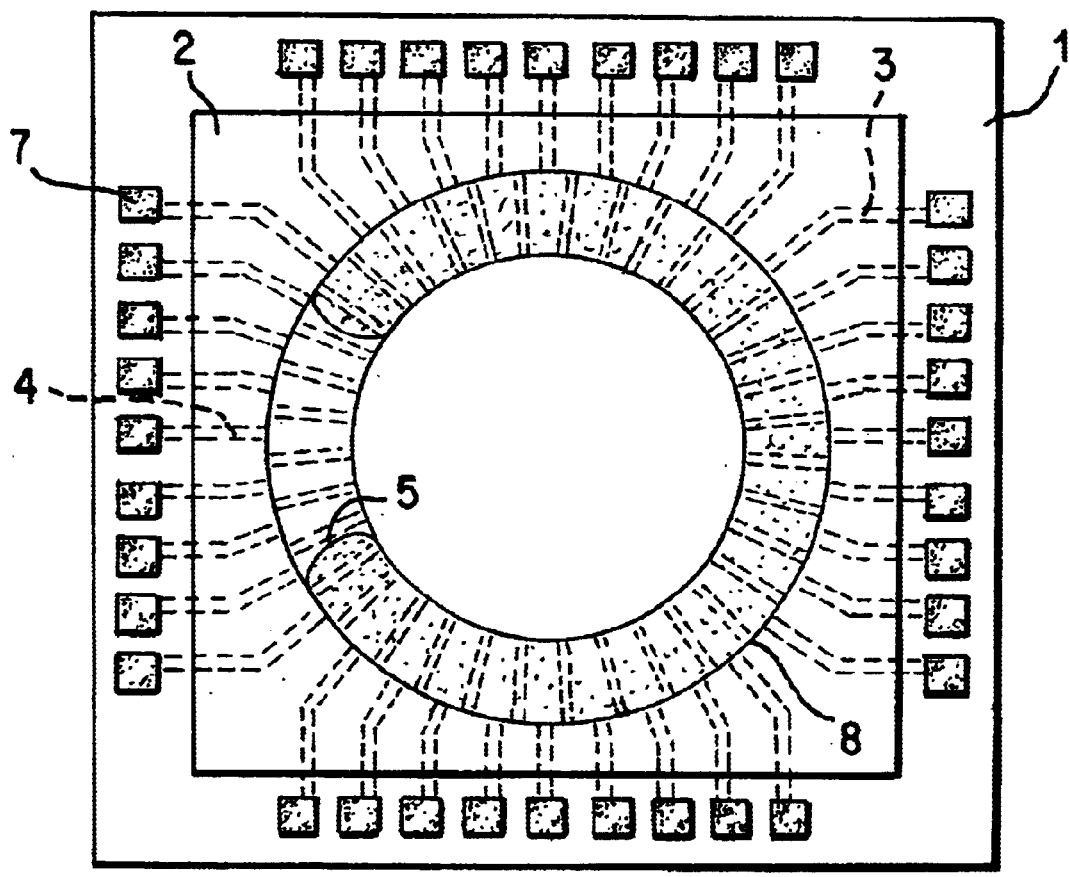

FIG. 1 is a cross sectional view and a top view of the peristaltic pump actuator, where the drive element of the micropump is depicted as a peristaltic actuator, which functions analogously to a flexible tube pump. A membrane (2) is stretched across a preferably ring-shaped notch (8), which forms an endlessly continuous channel for a drive medium and which exhibits a cross section (cavity), in a substrate surface. If the substrate (1) and the membrane are joined together under normal pressure, for example in air, then a specific volume of air is entrapped in the cavity. Thus, the pump actuator is formed between a moveable membrane and a fixed substrate by means of a closed cavity of arbitrary shape. This cavity is filled with a gas or a liquid (drive medium (17)), for example air. If the drive medium comprises an incompressible liquid, then the number of driveable electrodes is stipulated by the entrapped volume of liquid. The membrane is electrically conductive and/or conductively coated. It can be made, for example, of silicon, metal or plastic. The substrate can be made of an arbitrary solid material. Several insulated electrodes (3, 4), which can be driven at least to some degree independently of each other, are buried on the floor of the cavity. The electrodes can be implanted, for example, in silicon. That is, they can comprise doped areas in the substrate or a thin metallic layer on an insulator, like glass, plastic or ceramic. For each separately driven electrode there is a contact pad (7). If an electric voltage is applied between the membrane. and one electrode or several of the electrodes, it pulls the membrane at these points in the downward direction (6). Since the volume below the membrane is entrapped, the displaced air, generally the drive medium, results in a bulging of the membrane at another site in the upward direction (5). If the electrodes are driven in a suitable manner, the bulge can be moved peristaltically along the cavity, and, in the case of the preferred curve, in a circle. On the left side of the top view a part of the electrodes are not driven (4), that is, not under voltage. Thus, the membrane can bulge upwards under the pressure of the entrapped drive medium.

Figure 2:
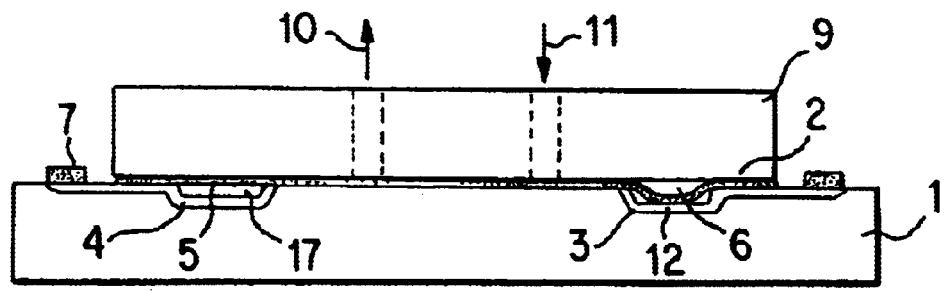
FIG. 2 depicts the inventive pump, comprising the drive element and a cover with inlet and outlet.

To build a pump, FIG. 2 shows how the drive element, i.e. the membrane, is tightly covered with a flat substrate cover (9), which is made, for example, of silicon, glass, metal, ceramic, or plastic and which contains the inlet (11) and the outlet (10) of the pump. This is done, for example, by bonding to the cover. The membrane (2) in the channel area is prevented from adhering to the cover due to special measures, for example, the application of a nonbondable layer. If, at this stage, a part of the electrodes are driven and, hence, the membrane is pulled downwards, the result at these locations is a pump channel between the membrane and the cover substrate. Through the inlet the channel can be filled with a pump medium (12). At other locations, where no voltage is applied, the displaced drive medium presses the membrane against the cover substrate. Thus, a seal is formed.

Figure 3:
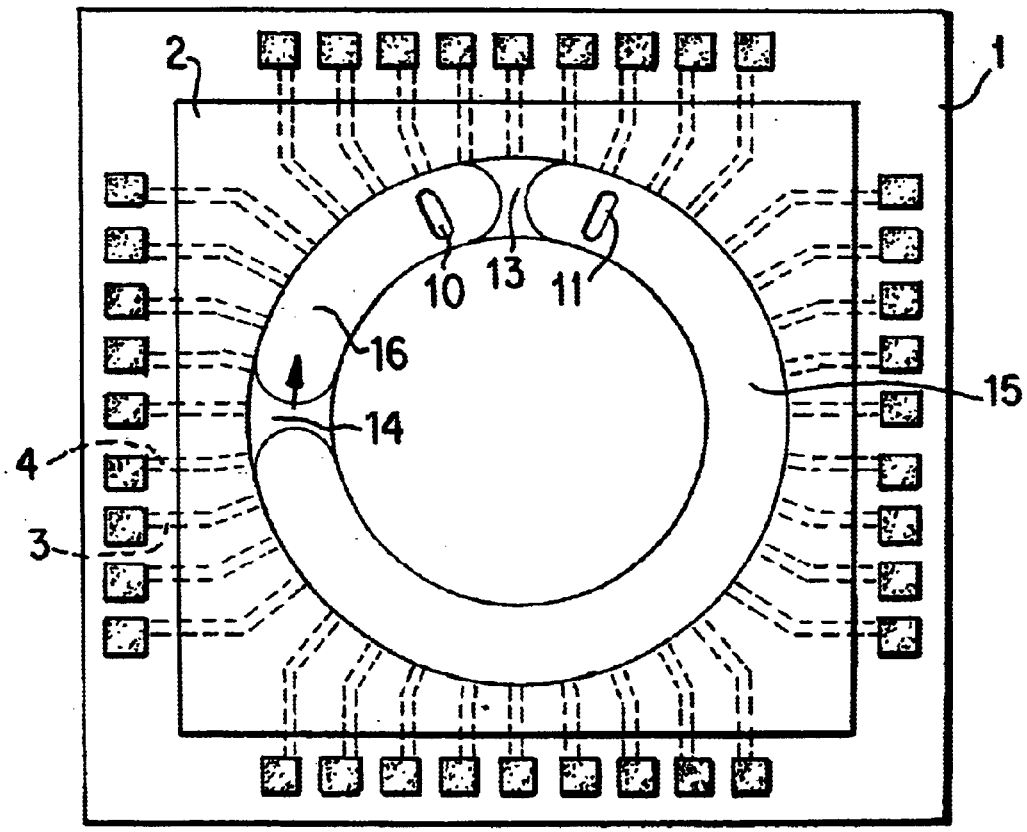
FIG. 3 depicts the design of two channels for the pump medium by forming two seals.
Figure 4A:
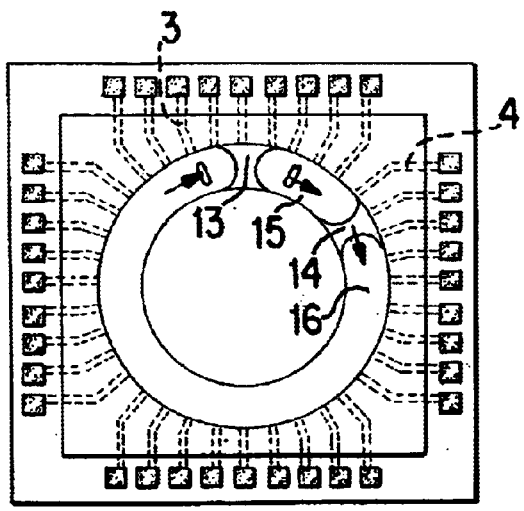
FIGS. 4a, 4b, 4c, 4d, and 4e illustrates the pumping process by means of a systematic representation of different positions of the seals during the pump cycles.
Figure 4B:
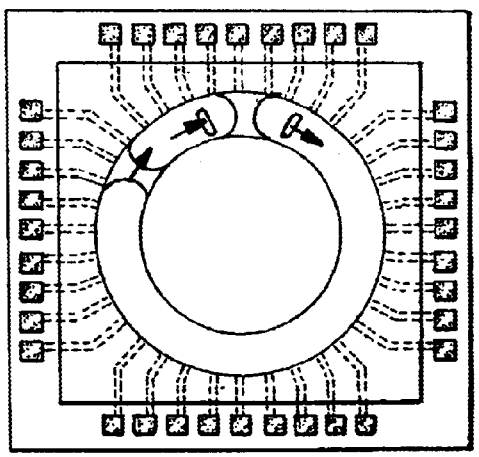
Figure 4C:
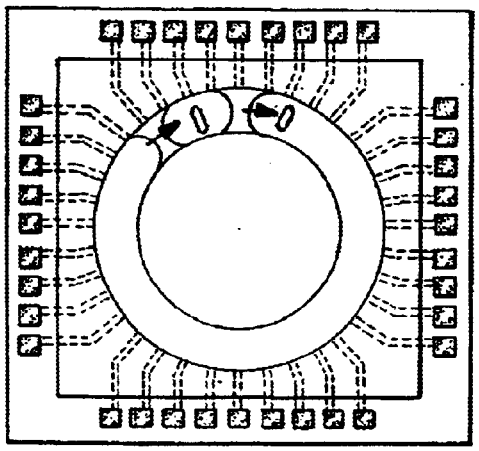
Figure 4D:
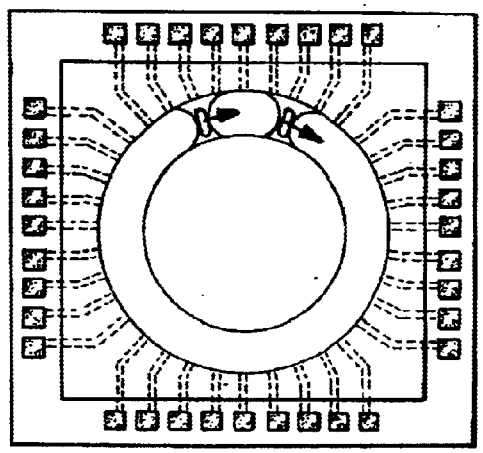
Figure 4E:
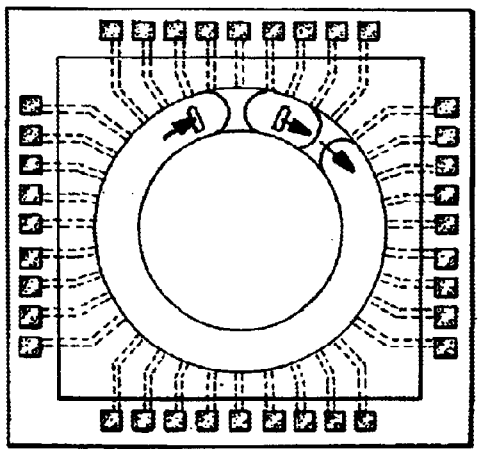

FIG. 3 show how two channels (15, 16) can be formed separately by means of two of these seals (13, 14) by suitably driving the electrodes. If seal 1 (13) is positioned between the inlet (11) and the outlet (10) and if seal 2 (14) is moved, the liquid is displaced out of channel 1 (16) into the outlet and liquid is sucked into channel 2 (15). If seal 2 reaches the outlet, both seals continue to move synchronously until seal 2 has reached the position between the openings. Then a new pump cycle begins with seal 1 functioning as the piston. The width of the seals and the openings must be chosen in such a manner that there is no possibility of a short circuit between the inlet and the outlet.

FIG. 4 illustrates the pumping process by means of a systematic representation of a pump cycle. If, for example, seal 1 is positioned between the inlet and the outlet and seal 2 is moved, the medium to be pumped from channel 1 is displaced into the outlet and at the same time sucked from the inlet into channel 2 by the medium to be pumped (FIGS. 4a, 4b). If seal 2 reaches the outlet, seal 1 is pushed further in synchronism (FIGS. 4c, 4d). The seals exchange the function; seal 2 remains standing; seal 1 migrates; that is, a new pump cycle begins (FIG. 4e). The pumping direction can be chosen as desired and is predetermined by actuating the buried electrodes.

Figure 5:
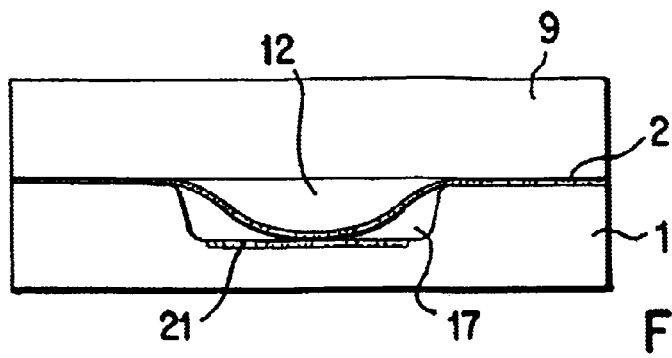
FIG. 5 is a cross sectional view of the channel for the pump medium with driven electrodes.

FIG. 5 shows the structure of the pump, formed by a closed cavity, filled with a drive medium, for example, a gas (17), with internal, separately driveable, electrodes (21). This array of electrodes, that can be driven separately with electricity, is located inside the cavity. The electrodes are fixed on the substrate (substrate (1)). The pump medium (12) to be transported is located between the membrane (2) and the cover (9). If an electric voltage is applied between the selected electrodes and the membrane, the membrane in this area is pulled down onto the floor of the cavity. Because the cavity is filled, for example, with gas, the membrane arches upward in the unselected areas (pneumatic coupling). The membrane seals in the arched areas against the flat or, for example, curved surface of a rigid cover. In contrast, there is a gap between the membrane and the cover in the driven areas. Thus, a pump medium, located between the membrane and the cover, can be moved so as to be defined.

Figure 6A:
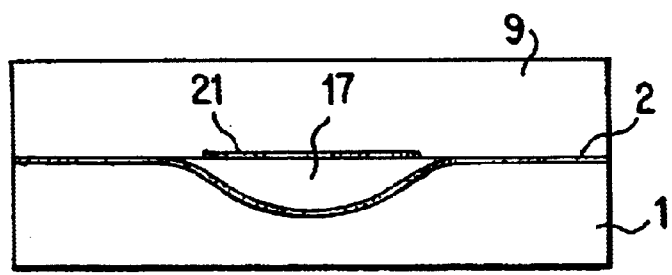
FIGS. 6a and 6b depict two other embodiments of the pump of the invention.
Figure 6B:
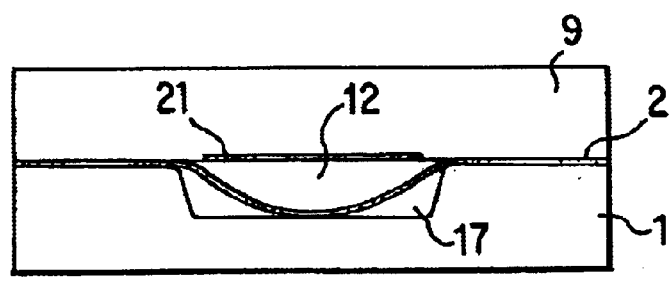

FIGS. 6a and 6b show two other embodiments of the described invention. In FIG. 6a the electrode array (21) is on the bottom side of the cover (9). Thus, the closed actuator cavity, filled with the drive medium (17), is formed between the cover and the membrane (2). The pump medium (12) to be transported is located between the membrane (2) and the substrate (1). Then the substrate (1) must be formed to conform so that the membrane seals against said substrate. In FIG. 6b the electrode array (21) lies outside the cavity, which is filled with the drive medium (17) and which is formed between the membrane (2) and the substrate (1), on the bottom side of the cover (9). Then the electric drive voltage decreases across the pump medium (12) to be transported.

Figure 7:
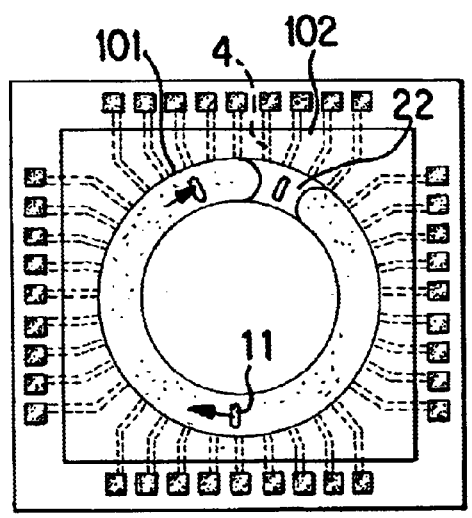
FIG. 7 depicts a valve, formed by the presence of two outlets at the pump of the invention.
Figure 8A:
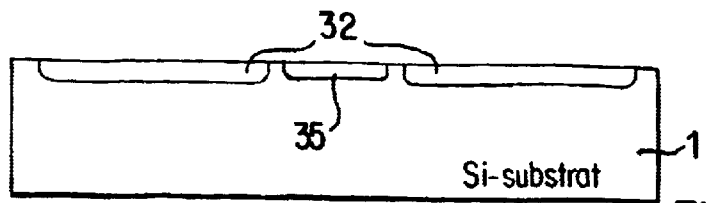
FIG. 8 illustrates the production process of the pump.
Figure 8B:
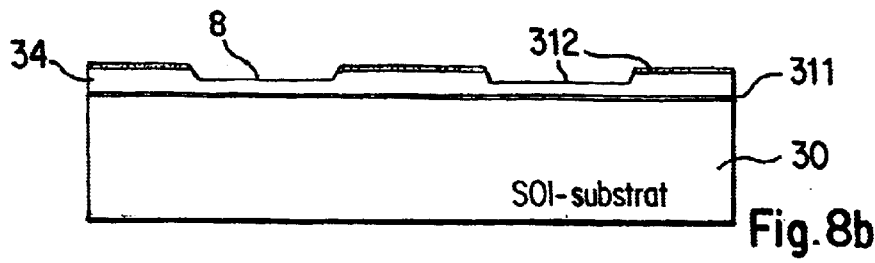
Figure 8C:
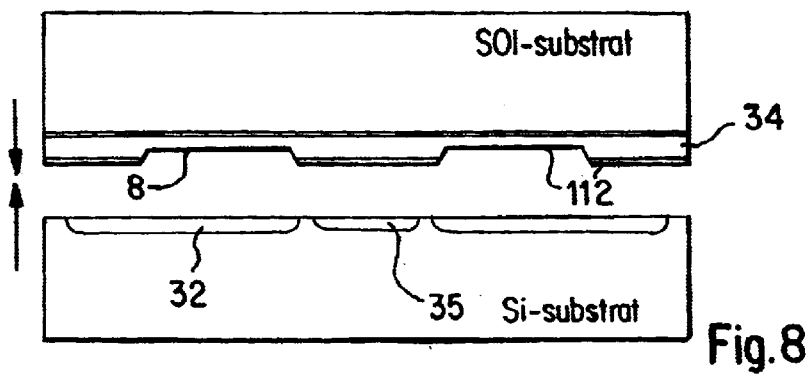
Figure 8D:
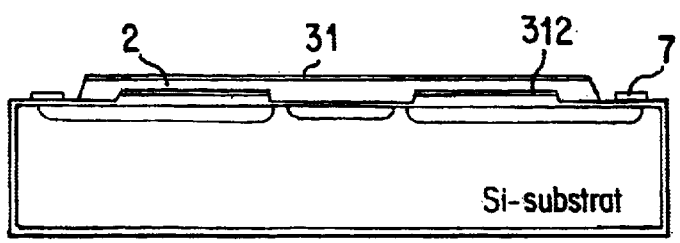
Figure 8E:
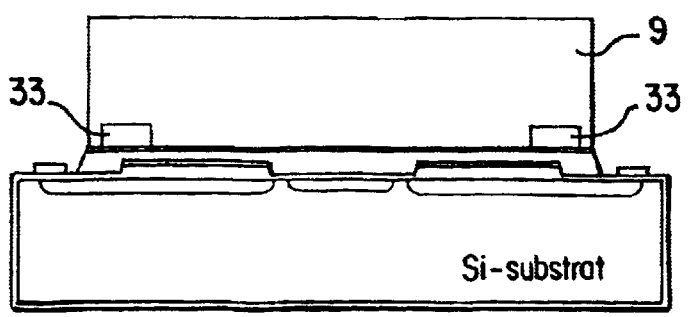

FIG. 7 depicts a valve on the basis of the pump structure, which is illustrated in FIG. 5 and exhibits an inlet (11) and two outlets (101, 102). The right outlet (102) is sealed analogously to the pump by forming a seal (22) below this opening, in that the membrane is pulled downwards in all areas outside the opening by driving the appropriate electrode. In contrast, the electrodes (4) below the opening (outlet (102)) are not driven so that the membrane at this point is pressed against the cover and the opening (outlet (102)) seals. To make this possible, the opening must be dimensioned correspondingly. If the cover has several feeds and/or discharges, which are intended for the gases or the liquids and which can be closed or opened independently of each other by suitably driving the electrodes, a valve can be realized, for example, with several inlets and/or outlets.

FIGS. 8a–8e depict the preferred production process of a pump, according to the invention. The production process comprises the following production steps:

1. In subprocess 1 (FIG. 8a) the drive electrodes (32) (preferably p+ doped with n+ doped contact areas (35)) of the pump actuator are produced by ion implantation on an n-conducting standard silicon substrate (1).

2. Subprocess 2 (FIG. 8b) includes the production of the pump cavity (8) in a silicon on insulator substrate (SOI substrate (30)). The cavity is etched in the SOI layer (34) (silicon layer over an insulating silicon oxide layer (311)). Then the surface of the SOI layer is oxidized. This oxide layer (312) serves as the insulation between the membrane and the implanted electrodes and is responsible for the compressive stress on the membrane. The silicon layer between the silicon oxide layer of the SOI substrate and the silicon oxide layer on the surface forms later the membrane.

3. The two substrates, prepared in the subprocesses 1 and 2, are adjusted to each other at atmospheric pressure (FIG. 8c) (indicated with arrows in the figure). At the same time air is entrapped in the volume of the cavity. When tempering, which is necessary for bonding, the oxygen of the entrapped air is consumed. It reacts with the surfaces enclosing the volume. Thus, a vacuum is produced inside the cavity.

4. In subprocess 3 (FIG. 8d) the two Si substrates are bonded together (silicon fusion bonding). The SOI substrate is sanded or etched, thus producing the membrane (2); and the actuator of the pump is prepared. This includes the opening of the SOI layer to expose the contact areas of the implanted electrodes, the etching of the contact holes and the metalization of the contact pads (7). To prevent the membrane from adhering to the cover during bonding, an anti-adhesive layer is applied in the membrane area.

5. Subprocess 4 (FIG. 8e) defines the pump medium feeds (33) (inlets and outlets) in the glass cover (glass substrate) (9), which, after the adjusted superpositioning, is bonded anodically with the pump actuators to the substrate. The spontaneously bulging membrane, which is preferably under compressive stress, is pressed against the cover. The channels can be etched, for example, by the wet chemical method. Then they are preferably guided sideways outwardly (as indicated in the figure) or are realized by means of boreholes.

What is claimed is:

1. A micromechanical pump comprising:
a substrate;
a cover;
a cavity formed in the upper side of said substrate, said cavity being endlessly continuous so as to form a channel for a drive fluid;
an electrically conductive or conductively coated membrane stretching across the cavity on an upper side of the substrate and positioned below said cover;
a plurality of insulated electrodes located on a bottom surface of said cavity, and
wherein said electrodes are selectively actuated to attract selected areas of the membrane, the selected areas forming respective gaps with the cover, and non-selected areas of the membrane being in sealing contact with the cover and forming a space with said substrate, said space being located in said cavity and being filled by the drive fluid.

2. A micromechanical pump according to claim 1, wherein:
said cover has an inlet and an outlet and when the electrodes are selectively actuated, the membrane acts in a peristaltic fashion such that a pumped fluid travels from the inlet, through the respective gaps and out the outlet.

3. A pump according to claim 1, wherein the plurality of electrodes correspond in size and shape to the cross sectional shaped of the cavity.

4. A pump according to claim 1, wherein the cavity is ring-shaped.

5. A pump according to claim 1, when an insulated electrode positioned on the bottom surface of the cavity is activated, a corresponding portion of said membrane is attracted to the activated electrode.

6. A pump according to claim 1, wherein one of the cover and substrate has at least one inlet or outlet.

7. A pump according to claim 1, wherein a drive fluid is located on an opposite side of the membrane from a pumped fluid, and, when the electrodes are selectively actuated, a pumping action results.

8. A pump according to claim 1, wherein at least one of the substrate, the membrane and the cover is made according to silicone technology; and the electrodes are implanted in silicone or represent a thin metallic layer on an insulator.

9. A pump according to claim 1, wherein an electric field between the electrodes and the membrane does not decrease across the drive fluid.

10. A pump according to claim 1, further comprising:
means for monitoring the selective activation of the electrodes.

11. A pump as claimed in claim 2, wherein:
when the electrodes are selectively driven, two channels, separated by two seals, whose width is selected to ensure a continuous connection between the inlet and outlet, are formed, and wherein the peristaltic movement of the seals occurs in such a manner that when a first of the two seals is positioned between the inlet and the outlet, a second of the two seals is moved in the direction of the outlet, and the pumped fluid is displaced from a first one of the two channels into the outlet and at the same time is sucked from the inlet into a second of the two channels, and when the second seal reaches the outlet, the first seal is pushed further in synchronism, whereupon the seals exchange the function and a new pumping cycle begins.

12. A pump as claimed in claim 2, wherein:
when the electrodes are selectively driven, two channels, separated by two seals, whose width is selected to ensure a continuous connection between the inlet and outlet, are formed, and wherein the peristaltic movement of the seals occurs in such a manner that when a first of the two seals is positioned between the inlet and the outlet, a second of the two seals is moved in the direction of the inlet, and the pumped fluid is displaced from a second of the two channels in direction of the inlet and at the same time is sucked from the outlet into a first of the two channels, and when the second seal reaches the inlet, the first seal is pushed further in synchronism, whereupon the seals exchange the function and a new pumping cycle begins.

13. A pump as claimed in claim 1, wherein a direction of the pumped fluid is reversed arbitrarily during operation.

14. A pump according to claim 2, wherein the electrodes are actuated in such a manner as to create a valving action on the inlet and outlet.

15. A process for producing a micromechanical pump, comprising the steps of:
providing a first substrate and applying or incorporating drive electrodes on in in the substrate;
providing a SOI substrate and forming a cavity which is formed to make a continuously endless channel in a SOI layer of the SOI substrate;
applying an insulating layer on the surface of the SOI layer;
adjusted joining of the surface of the insulating layer, applied on the SOI layer, with the surface of the first substrate, one which are located electrodes;
producing a membrane by thinning the SOI substrate up to the embedded insulator layer; and
providing a third substrate as the cover and joining the cover with the surface of the thinned SOI substrate outside the membrane area.

16. A process according to claim 15, wherein the drive electrodes are incorporated into the substrate by ion implantation.

17. A process according to claim 15, wherein the the insulating layer, applied on the surface of the SOI substrate after forming the cavity is oxidized.

18. A process according to claim 15, wherein the joining of the substrates is carried out by anodic bonding.

19. A micromechanical pump comprising:
a substrate;
a cover;
a cavity formed in the upper side of said substrate, said cavity being endlessly continuous so as to form a channel for a drive fluid;
an electrically conductive or conductively coated membrane stretching across the cavity on an upper side of the substrate and positioned below said cover;
a plurality of insulated electrodes on the surface of the cover and facing the membrane;
wherein said electrodes are selectively actuated to attract selected areas of the membrane, the selected areas being in sealing contact with the cover, and non-selected areas of the membrane forming respective gaps with the cover, the membrane forming a space with said substrate, said space being located in said cavity and being filled by the drive fluid.

* * * * *